US008937796B2

(12) United States Patent
Xiao et al.

(10) Patent No.: US 8,937,796 B2
(45) Date of Patent: *Jan. 20, 2015

(54) VARIABLE FREQUENCY DRIVE AND METHODS FOR FILTER CAPACITOR FAULT DETECTION

(75) Inventors: Yuan Xiao, Kitchener (CA); Navid Zargari, Cambridge (CA); Manish Pande, Cambridge (CA); Vijay Khatri, Brampton (CA)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 289 days.

This patent is subject to a terminal disclaimer.

(21) Appl. No.: 13/532,906

(22) Filed: Jun. 26, 2012

(65) Prior Publication Data

US 2012/0271572 A1 Oct. 25, 2012

Related U.S. Application Data

(63) Continuation of application No. 12/789,853, filed on May 28, 2010, now Pat. No. 8,259,426.

(51) Int. Cl.

| | |
|---|---|
| ***H02H 3/00*** | (2006.01) |
| ***H02M 5/451*** | (2006.01) |
| ***H02M 1/32*** | (2007.01) |
| ***H02M 5/458*** | (2006.01) |
| ***H02M 7/525*** | (2006.01) |
| ***H02M 7/539*** | (2006.01) |
| *H02J 3/00* | (2006.01) |
| *H02J 3/36* | (2006.01) |
| *H02M 5/40* | (2006.01) |
| *H02M 7/06* | (2006.01) |

(52) U.S. Cl.

CPC ................ *H02M 5/451* (2013.01); *H02M 1/32* (2013.01); *H02M 5/458* (2013.01); *H02M 5/4585* (2013.01); *H02M 7/525* (2013.01); *H02M 7/539* (2013.01)

USPC .................. 361/88; 363/34; 363/35; 363/126

(58) Field of Classification Search

CPC ................................ H02M 7/00; H02M 5/458

USPC ............................................................ 363/35

See application file for complete search history.

(56) References Cited

U.S. PATENT DOCUMENTS

| | | | |
|---|---|---|---|
| 5,319,513 | A | 6/1994 | Lowenstein et al. |
| 5,796,258 | A | 8/1998 | Yang |
| 6,166,929 | A | 12/2000 | Ma et al. |
| 6,269,010 | B1 | 7/2001 | Ma et al. |
| 6,366,483 | B1 | 4/2002 | Ma et al. |
| 6,525,951 | B1 | 2/2003 | Paice |
| 6,642,689 | B2 | 11/2003 | Ishida et al. |

(Continued)

OTHER PUBLICATIONS

ABB Bay Control REC670 Application manual, Relion 670 series, http://www05./abb.com/global/scot/scot354.nsf, Oct. 10, 2011, pp. 1-586 (2 parts).

(Continued)

*Primary Examiner* — Dharti Patel

(74) *Attorney, Agent, or Firm* — Fay Sharpe LLP

(57) ABSTRACT

Variable frequency motor drives and control techniques are presented in which filter capacitor faults are detected by measuring filter neutral node currents and/or voltages and detecting changes in a frequency component of the measured neutral condition and/or based on input current unbalance.

24 Claims, 8 Drawing Sheets

(56) References Cited

U.S. PATENT DOCUMENTS

| | | | | |
|---|---|---|---|---|
| 7,274,576 | B1 | 9/2007 | Zargari et al. | |
| 7,495,410 | B2 * | 2/2009 | Zargari et al. | 318/729 |
| 7,495,938 | B2 | 2/2009 | Wu et al. | |
| 7,511,976 | B2 | 3/2009 | Zargari et al. | |
| 7,616,005 | B2 | 11/2009 | Kalyuzhny et al. | |
| 7,683,568 | B2 * | 3/2010 | Pande et al. | 318/729 |
| 7,764,523 | B2 | 7/2010 | Conticelli et al. | |
| 7,782,009 | B2 * | 8/2010 | Wiseman | 318/801 |
| 7,786,735 | B2 | 8/2010 | Kalyuzhny et al. | |
| 7,812,615 | B2 | 10/2010 | Gajic et al. | |
| 8,009,450 | B2 * | 8/2011 | Royak et al. | 363/84 |
| 8,044,631 | B2 * | 10/2011 | Dai et al. | 318/800 |
| 8,259,426 | B2 * | 9/2012 | Xiao et al. | 361/88 |
| 8,350,397 | B2 * | 1/2013 | Lang et al. | 290/44 |
| 8,395,910 | B2 * | 3/2013 | Alexander | 363/17 |
| 8,400,800 | B2 * | 3/2013 | Alexander | 363/123 |
| 8,587,160 | B2 * | 11/2013 | Dai et al. | 307/151 |
| 8,729,844 | B2 * | 5/2014 | Feng et al. | 318/400.3 |
| 2007/0211501 | A1 | 9/2007 | Zargari et al. | |
| 2007/0297202 | A1 | 12/2007 | Zargari et al. | |
| 2008/0180055 | A1 | 7/2008 | Zargari et al. | |
| 2009/0128083 | A1 | 5/2009 | Zargari et al. | |
| 2010/0025995 | A1 | 2/2010 | Lang et al. | |
| 2010/0080028 | A1 | 4/2010 | Cheng et al. | |
| 2013/0057297 | A1 | 3/2013 | Cheng | |

OTHER PUBLICATIONS

Transformer protection RET670 ANSI Application manual, Relion 670 series, http://www.abb.com/product/db0003db004281/c12573e700330419c/257f000263ad5.aspx#!, May 6, 2011, pp. 1-864 (2 parts).

"Protective Relays", iCP-630 Capacitor Bank Protection Relay, Cooper Power Systems, Jan. 2011, pp. 1-8.

ABB Distribution Automation Handbook, Section 8.10 Protection of Capacitor Banks, Mar. 5, 2011.

GE C70 Capacitor Bank Protection and Control System UR Series Instruction Manual C70 Revision: 6.0x, Copyright @ 2011, GE Multilin, http://www.GEmultilin.com, pp. 1-644 (2 parts).

"iCP-630 Capacitor Bank Protection Relay", Cooper Power Systems, Mar. 2007.

U.S. Application No. 13/570,781, "Filter Capacitor Degradation Detection Apparatus and Method", by Patel et al., filed Aug. 9, 2012.

* cited by examiner

VARIABLE FREQUENCY DRIVE AND METHODS FOR FILTER CAPACITOR FAULT DETECTION

REFERENCE TO RELATED APPLICATION

This application is a continuation of and claims priority to and the benefit of U.S. patent application Ser. No. 12/789,853, filed on May 28, 2010, entitled VARIABLE FREQUENCY DRIVE AND METHODS FOR FILTER CAPACITOR FAULT DETECTION, the entirety of which application is hereby incorporated by reference.

BACKGROUND

The present disclosure relates generally to variable frequency electrical power conversion systems and more particularly to variable frequency drives (VFDs) and techniques for detecting faults in drive filter capacitors. Motor drives are electric power conversion systems that convert input power from a line-side source to a different form to provide controlled drive currents to the windings of an electric motor, where the output frequency is variable. VFDs typically include a passive or active rectifier with AC input power being rectified to create DC link power in an intermediate DC circuit. The intermediate DC power is fed to an output inverter which creates a variable frequency single or multi-phase AC output driving a motor load at a controlled speed and torque. VFDs often include filter circuits at the input and/or load output, including filter capacitors. Failure or other fault conditions in the filter capacitors can adversely affect the drive operation, and previous systems employed pressure relays to detect change in pressure inside the capacitor, or monitoring of three phase capacitor currents to detect capacitor failures. However, such techniques require extra components and increase the size, cost, and complexity of motor drives. Thus, there is a need for improved variable frequency drives by which the adverse effects of filter capacitor failure can be avoided or mitigated by detecting capacitor fault conditions without adding to the system cost and size.

SUMMARY

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present some concepts of the disclosure in a simplified form prior to the more detailed description that is presented hereinafter. The present disclosure provides for measurement of capacitor neutral voltage and/or current and use of the change in fundamental frequency component of this neutral characteristic to detect failure in the filter capacitor. The disclosure finds utility in detecting faults in input and/or output filter capacitors for current source converters and voltage source converter type VFDs, and certain embodiments utilize feedback information used in general motor drive control by which the advantages of early fault detection can be facilitated without addition of extra sensing equipment.

In accordance with one or more aspects of the present disclosure, a variable frequency drive is provided, which includes a rectifier, an intermediate DC circuit, an inverter, and one or more filter circuits having filter capacitors coupled to a neutral node. The rectifier can be active or passive, and includes an input receiving AC electrical input power and a DC output providing rectified DC electrical power to the intermediate DC circuit. The inverter includes an AC output with a plurality of AC output nodes for supplying power to a load, and an inverter switching network with switching devices individually coupled between one of the DC current paths of the intermediate DC circuit and one of the AC output nodes. The inverter switches are operated to selectively couple a corresponding DC current path with the corresponding AC output node according to a corresponding inverter switching control signal to provide variable frequency AC electrical power to the load. A control system provides the inverter switching control signals to cause the inverter to selectively convert DC current from the intermediate DC circuit to provide AC electrical power to the AC output according to one or more setpoint signals or values. A feedback circuit senses a condition of the neutral node, such as neutral current or neutral voltage in certain embodiments, and provides one or more neutral feedback signals based on the sensed neutral condition(s).

A capacitor fault detection circuit receives the feedback and extracts a measured fundamental frequency component from the neutral feedback signal or value at a fundamental frequency of the AC electrical input power. In certain embodiments, the capacitor fault detection circuit performs digital filtering and/or fast Fourier transform (FFT) on the neutral feedback signal or value to extract the measured fundamental frequency component. The fault detection circuit determines whether or not a fault condition is suspected in one or more of the filter capacitors based at least in part on the measured fundamental frequency component. In certain embodiments, the fault detection circuit determines a fundamental component change value by subtracting the measured fundamental frequency component from a no-fault fundamental frequency component value, and determines whether a fault is suspected based at least partially on the fundamental component change value. In certain embodiments, the fault detection circuit compares the fundamental component change value to a threshold value and to determine that a fault condition is suspected if the fundamental component change value exceeds the threshold. In certain embodiments, moreover, the capacitor fault detection circuit makes the fault suspicion determination based at least in part on one or more input current unbalance values associated with the AC electrical input power.

In accordance with further aspects of the disclosure, a method is provided for detecting filter capacitor faults in a variable frequency drive. The method includes measuring condition(s) of a neutral node coupled to a plurality of filter capacitors of at least one filter circuit of a variable frequency drive, such as current, voltage, etc., and extracting a measured fundamental frequency component from the measured neutral condition at a fundamental frequency of AC electrical input power provided to the drive. The method further includes determining whether a fault condition is suspected in one or more filter capacitors based at least in part on the measured fundamental frequency component. In certain embodiments, the method includes subtracting the measured fundamental component from a no-fault fundamental frequency component value to determine a fundamental component change value, and determining whether a fault condition is suspected based at least partially on the fundamental component change value, such as by comparing the fundamental component change value to a threshold value, and determining that a fault condition is suspected in at least one of the filter capacitors if the fundamental component change value is greater that the threshold value. In other embodiments, the method may include determining whether a fault condition is suspected based at least partially on an input current unbalance value or values associated with the AC electrical input power.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
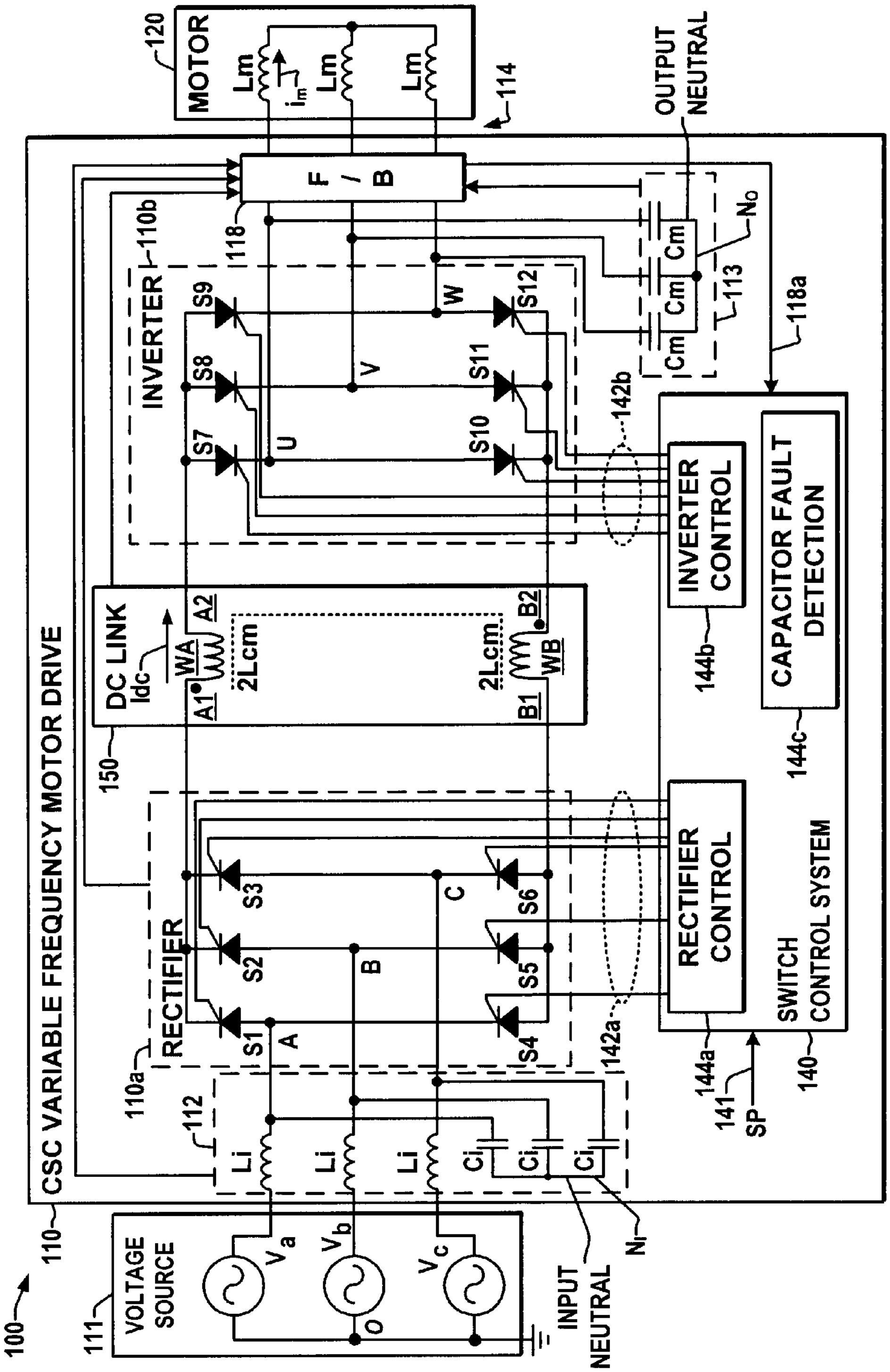
FIG. 1 is a schematic diagram illustrating an exemplary current source converter variable frequency motor drive with a capacitor fault detection component according to one or more aspects of the present disclosure.

Referring now to the figures, several embodiments or implementations are hereinafter described in conjunction with the drawings, wherein like reference numerals are used to refer to like elements throughout, and wherein the various features are not necessarily drawn to scale. The disclosure involves protecting the AC filter capacitors in variable frequency drives by detecting current or voltage unbalance in the fundamental frequency component (e.g., 60 Hz or 50 Hz for Europe), such as by comparing measured neutral fundamental component with a no-fault fundamental component value. The inventors have appreciated that unlike utility type power converters, variable frequency motor drives provide output voltages and currents at a variety of frequencies, due to the variable frequency nature of the output as well as the switching operation of the inverter and active rectifiers. Simple measurement of neutral voltages or currents in these drives does not allow reliable identification of fault conditions, since the neutral signals have a variety of distinct frequency components that change during operation. For example, in certain embodiments of the presently disclosed techniques, a 60 Hz fundamental frequency component of the capacitor neutral voltage/current is extracted from a signal which also includes a 180 Hz component and high frequency components. The detection of suspected capacitor fault conditions can then be indicated to a user or automatic remedial actions can be taken for controlled shutdown or other safe operation of the VFD. This facilitates early detection to minimize the occurrence of capacitor failures. The disclosed systems and techniques, moreover, can be implemented using sensed values also used for motor drive control, and thus no extra parts are needed. The disclosed concepts may also be used for harmonic filters in power conversion equipment.

Figure 11:
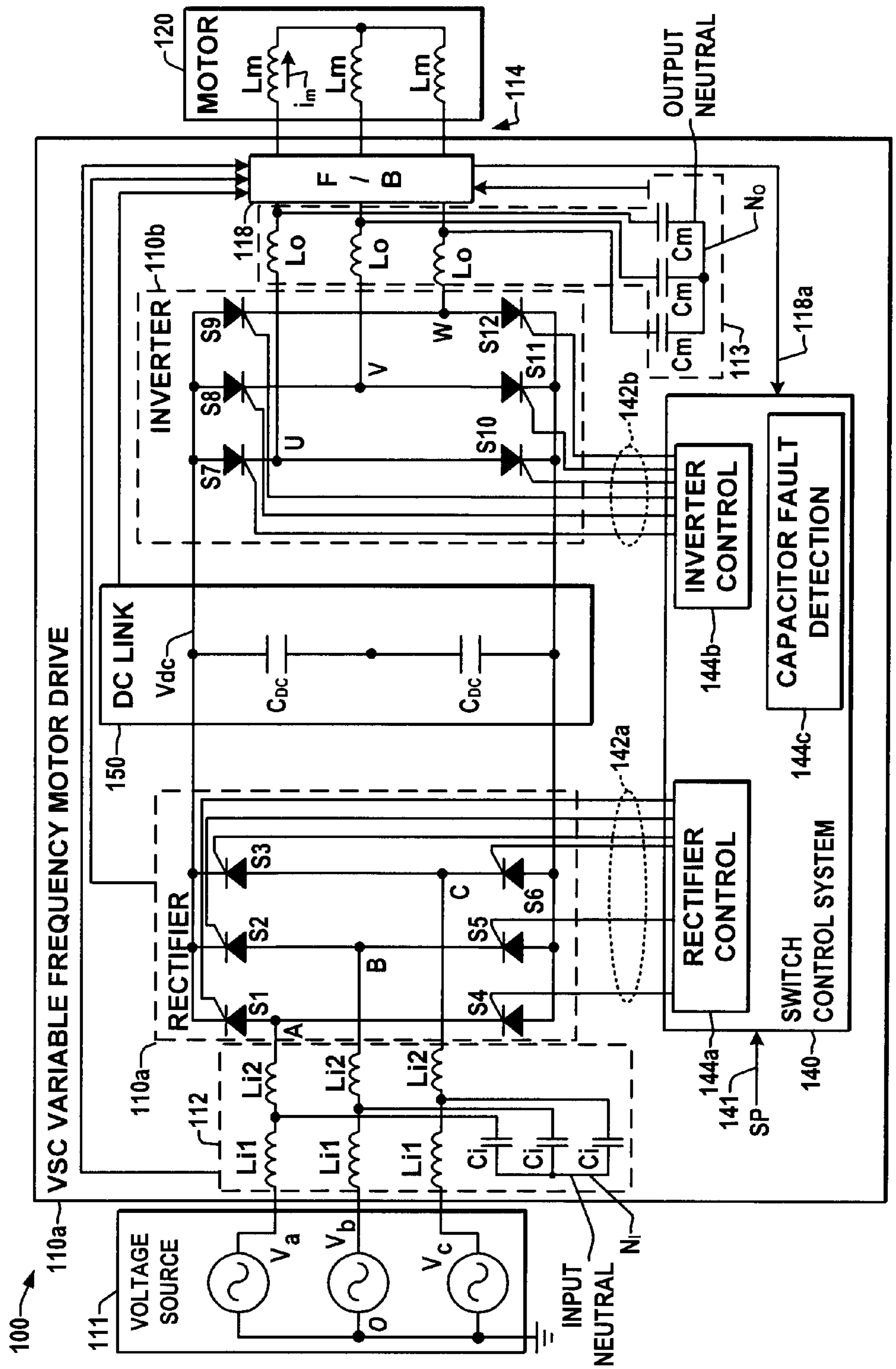
FIG. 11 is a schematic diagram illustrating an exemplary voltage source converter variable frequency motor drive with a capacitor fault detection component according to one or more aspects of the present disclosure.

Referring initially to FIG. 1, a power conversion system 100 is shown, having a capacitor fault detection component 144*c* in accordance with certain aspects of the disclosure. The drive 110 includes an exemplary three-phase AC voltage source 111 providing input power to a variable frequency motor drive (VFD) 110 that converts the input power to drive a motor load 120 coupled to a converter output 114. The drive 110 in this embodiment is a current source converter (CSC) type, with an input 112 connected to the AC power source 111 (FIG. 11 below illustrates a voltage source converter embodiment). While these examples are illustrated as having a three phase input 112, other embodiments may provide a single phase AC input or may include a multiphase input adapted to receive three or more input phases.

The CSC drive 110 in FIG. 1 provides variable frequency, variable amplitude single or multiphase AC output power at output terminals 114 to drive an AC motor load 120, which has three phase windings in the illustrated example. The output 114 in other embodiments may provide a single phase AC output or may be of any number of phases. The motor drive 110 includes both input filter capacitors Ci in the input circuit 112, as well as output filter capacitors Cm. The input filter capacitors Ci are coupled between corresponding input phase lines A, B, and C and an input neutral node $N_I$. Output capacitors Cm are individually coupled between a corresponding output phase line U, V, and W and an output neutral node $N_O$. Certain embodiments may omit either of the input or output filter capacitor sets. The input and output neutral nodes $N_I$, $N_O$ may be floating in certain embodiments, or one or both of the neutrals $N_I$, $N_O$ may be coupled to the ground of the input power source or to another ground. In still other possible embodiments, the neutrals $N_I$, $N_O$ may be coupled to one another without reference to any system ground.

The drive 110 includes a rectifier 110*a* receiving the AC input power from the source 111 via an input 112, as well as an intermediate DC circuit 150 with a DC link choke having upper and lower windings WA and WB coupled between the rectifier 110*a* and an output inverter 110*b*. In certain embodiments, the DC link could be a simple DC link inductor or a common mode choke as in the illustrated example. The illustrated drive 110, moreover, provides input filtering including inductors Li in each input phase and input filter capacitors Ci coupled between the input lines A, B, C, and the input neutral node $N_I$. The rectifier 110*a* in the embodiment of FIG. 1 is a current source rectifier (CSR) coupled with a current source inverter (CSI) 110*b* by the intermediate DC circuit 150, and one or more isolation components (e.g., transformers, not shown) may optionally be included in the drive 110. The output 114 provides output electrical power to the motor load 120 via lines U, V, and W, and includes a filter circuit 113 with the output capacitors Cm coupled between the load 120 and the output neutral node $N_O$.

The rectifier 110*a* in certain embodiments may be a passive rectifier with rectifier diodes. In the illustrated embodiment, the rectifier 110*a* is an active switching rectifier with switching devices S1-S6 coupled between the input 112 and the DC circuit 150 and operates according to a plurality of rectifier switching control signals 142*a* provided by a rectifier control component 144*a* of a switch control system 140. In operation, the AC input power is switched by the rectifier switches S1-S6 to create an intermediate DC bus current Idc in the intermediate circuit 150. The inverter 110*b* includes switching devices S7-S12 coupled between the DC circuit 150 and lines U, V, and W of the output 114. The inverter switches S7-S12 are operated according to corresponding switching control signals from an inverter control component 144*b* of the switch control system 140 to selectively convert DC power from the DC circuit 150 to provide the AC output power to drive the motor load 120. The DC link choke or inductor links the switches of the rectifier 110*a* and the inverter 110*b*, and provides forward and return current paths therebetween. The first winding WA in a forward or positive DC path of the link choke has a first end A1 connected to the upper rectifier switches S1-S3 and a second end A2 coupled with the upper inverter switches S7-S9, and the second winding WB in a negative or return DC path has a first end B1 coupled to the lower rectifier switches S4-S6 and a second end B2 coupled to the lower inverter switches S10-S12.

The rectifier and inverter switching devices S1-S12 may be any suitable controllable electrical switch types (e.g., IGCTs, GTOs, thyristors, IGBTs, etc.) that are controlled according to any suitable type or form of switching scheme or schemes, such as phase control, pulse width modulation, etc., in open or closed-loop fashion. In certain embodiments, the switching devices S7-S12 of the inverter 110*b* are forced commutated devices including without limitation SGCTs, IGBTs or GTOs, and the switching devices S1-S6 of the rectifier 110*a* can be force commutated devices such as those mentioned above as well as line commutated devices such as Thyristors. In this regard, Thyristor devices could used for the inverter switching devices S7-S12 in the form of forced commutated devices with extra circuitry added to the device triggering circuit thereof.

The rectifier 110*a* and the inverter 110*b* operate under control of a switch control system 140 comprised of one or more processors and associated memory as well as I/O circuits including driver circuitry for generating switching control signals 142 to selectively actuate the switching devices, although separate switching control systems may be employed, for example, with interconnections and information sharing to facilitate the coordinated operation of the rectifier 110*a* and the inverter 110*b*. The switch control system 140 in these embodiments includes an inverter control component 144*b* providing the inverter switching control signals 142*b* to cause the inverter 110*b* to selectively convert DC current from the DC circuit 150 to provide AC electrical power to the AC output 114 according to one or more setpoints 141, such as desired motor speed, torque, etc. The switch control system 140 and the components 144 thereof can be implemented as any suitable hardware, processor-executed software, processor-executed firmware, programmable logic, or combinations thereof, operative as any suitable controller or regulator by which the motor 120 is controlled according to one or more desired profile(s) or setpoint(s) in open or closed-loop fashion.

In operation, moreover, a rectifier control component 144*a* of the controller 140 provides the rectifier switching control signals 142*a* to convert AC electrical input power to provide a regulated DC current Idc to the DC circuit 150. In doing so, the rectifier controller 144*a* may employ one or more feedback signals or values 118*a*, such as a measured DC current value from the rectifier 110*a* representing the actual DC current Idc. The DC link current provided by the rectifier 110*a* thus provides input current for conversion by the inverter 110*b*, where the exemplary inverter control 144*b* provides a desired DC link current signal or value as a setpoint to the rectifier controller 144*a*. In this manner, the rectifier 110*a* provides the DC current required by the inverter 110*b*, and the rectifier controller 144*a* may also implement other control functions such as power factor correction, while the inverter controller 144*b* performs the necessary motor control operation of the drive 110.

The drive 110 also includes a feedback system 118 operatively coupled with the input 112, the rectifier 110*a*, the DC circuit 150, the inverter 110*b*, the output filter circuit 113, and the output 114. The feedback system 118 includes one or more sensing elements operative to provide one or more feedback signals and/or values 118*a* indicative of electrical conditions at the input 112, the rectifier 110*a*, the intermediate DC circuit 150, the inverter 110*b*, the output filter 113, and/or at the output 114. The switch control system 140 may be provided with one or more setpoints or desired values 141 and one or more feedback signals or values 118*a* from the feedback system 118 by which one or more closed loop motor drive control goals are achieved in normal operation.

Feedback signals or values for the control functions can be based on signals and/or values 118*a* from the feedback system 118, measured input values (e.g., line voltages, currents, etc.), and other information, data, etc., which may be in any suitable form such as an electrical signal, digital data, etc., and which may be received from any suitable source, such as an external network, switches, a user interface associated with the system 100, or other suitable source(s). The feedback circuit 118 provides feedback signal(s) or value(s) to the controller 140 from at least one of the rectifier 110*a*, the DC circuit 150, and the inverter 110*b*, including measured motor speed values through appropriate tachometers or other sensors, and/or sensed values from which motor speed, torque, current, and/or voltage, etc. may be determined by the controller 140. In this regard, sensorless motor speed feedback values may be generated internally by the controller 140 via suitable motor models based on the feedback signals or values 118*a* even for systems having no direct motor speed measurement sensors.

In the illustrated embodiments, moreover, the feedback circuit 118 also provides one or more feedback signals or values 118*a* to the capacitor fault detection component of the controller 140 based on a sensed condition of one or both of the neutral nodes $N_I$ and/or $N_O$. In various embodiments, feedback conditions are sensed at either or both of the neutral nodes $N_I$ and/or $N_O$, and at either or both of these nodes, such neutral feedback signal or value 118*a* can be based on a sensed voltage of the neutral node $N_I$, $N_O$ and/or a sensed current of the neutral node $N_I$, $N_O$.

Figure 2:
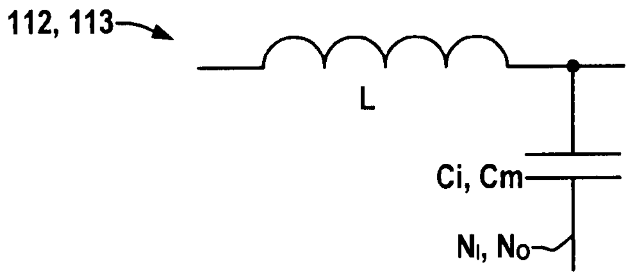
FIGS. 2-4 are schematic diagrams illustrating several exemplary filter capacitor configurations for VFDs.
Figure 3:
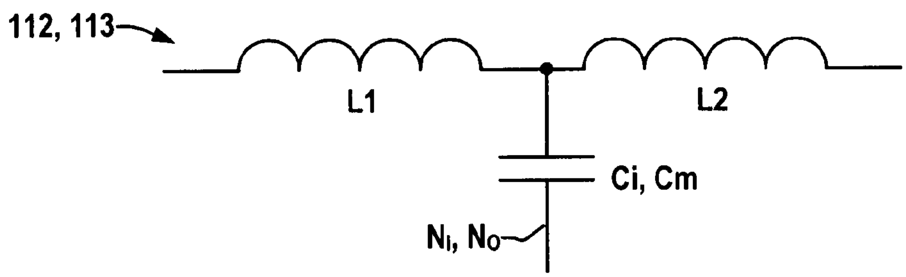
Figure 4:
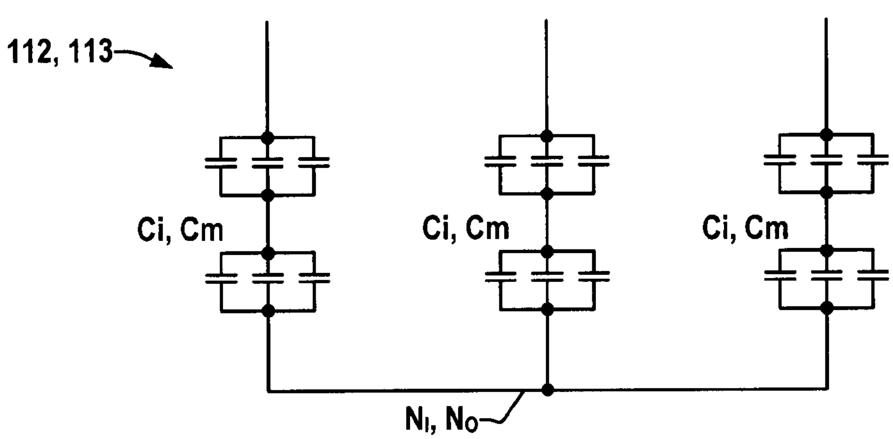
Figure 5:
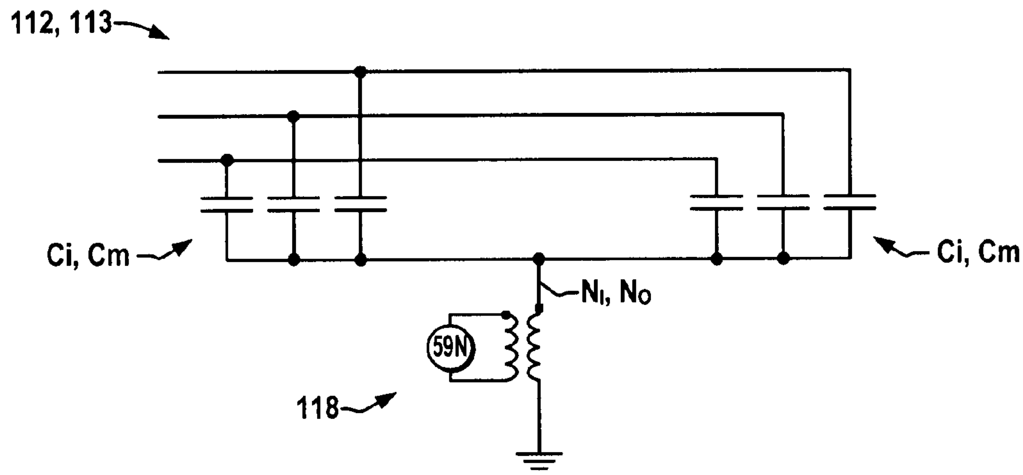
FIGS. 5 and 6 are schematic diagrams illustrating exemplary neutral current and neutral voltage sensing circuits.
Figure 6:
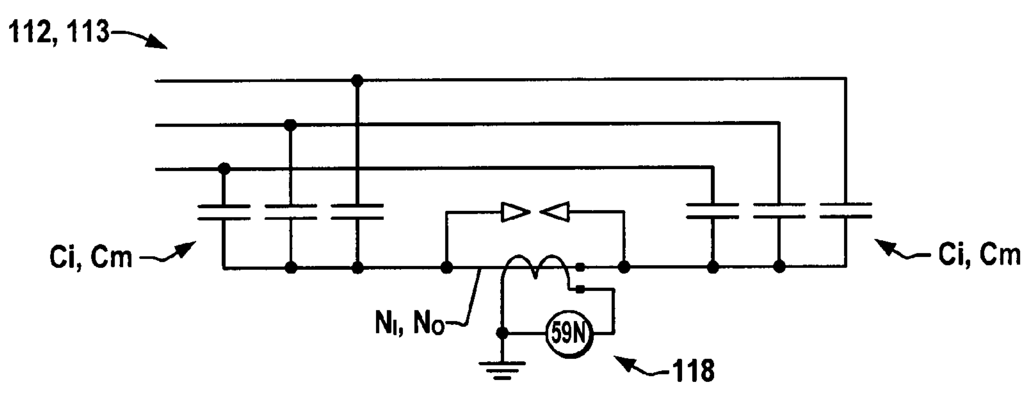

Referring also to FIGS. 2-6, FIGS. 2-4 show several exemplary filter capacitor configurations in which filter capacitors Ci, Cm can be connected to a neutral node $N_I$, $N_O$, whether alone or in combination with other filtering components, such as inductances L, L1, L2 in FIGS. 2 and 3. Moreover, as shown in FIG. 4, the filter capacitances Ci, Cm can individually be implemented as two or more capacitor devices. In addition, any suitable neutral node condition sensing configurations and sensor apparatus may be used, examples of which are shown in FIGS. 5 and 6. The feedback circuitry 118 in FIG. 5 includes an exemplary sensor for sensing the voltage of the neutral node $N_I$, $N_O$ with respect to ground. FIG. 6 illustrates an exemplary sensor of the feedback system 118 operative to sense current in the neutral node $N_I$, $N_O$.

Figure 7:
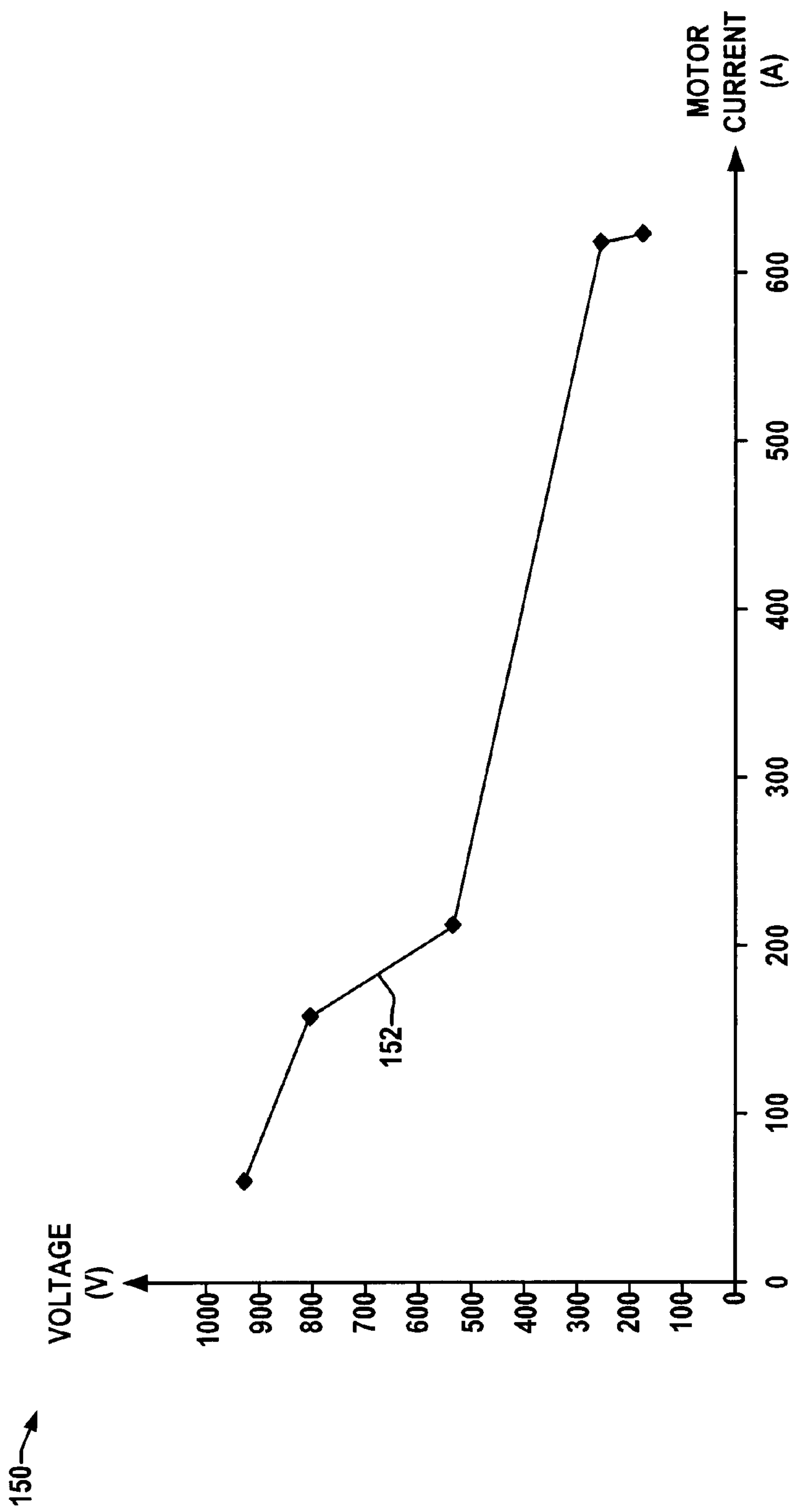
FIG. 7 is a graph illustrating change in a fundamental frequency component of a neutral-to-ground voltage in a VFD.
Figure 8:
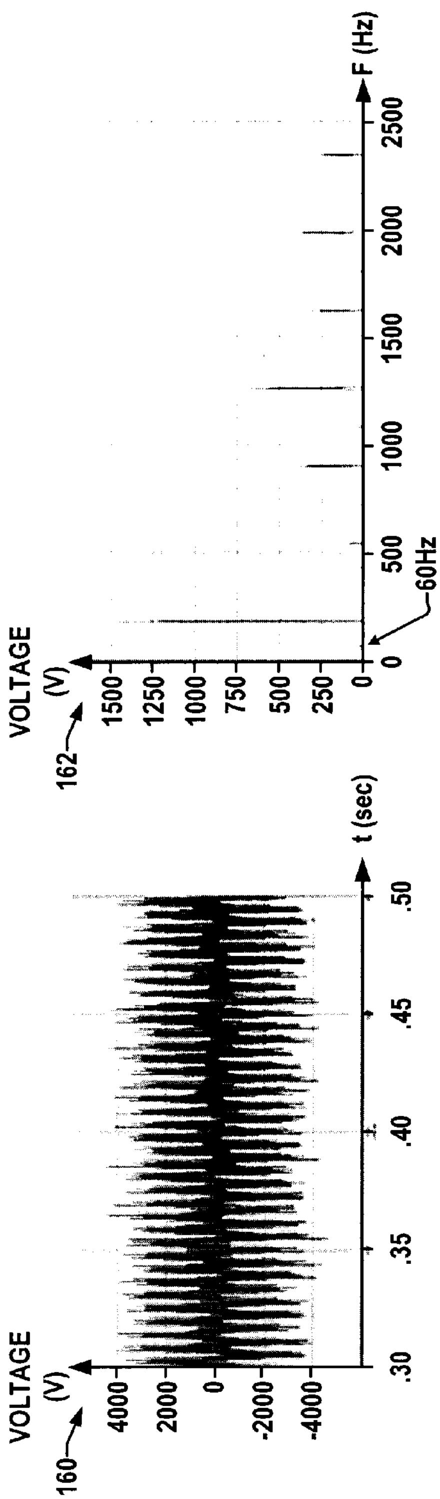
FIGS. 8 and 9 are composite time domain and frequency domain graphs illustrating change in a fundamental frequency component of a neutral-to-ground voltage in a VFD.
Figure 9:
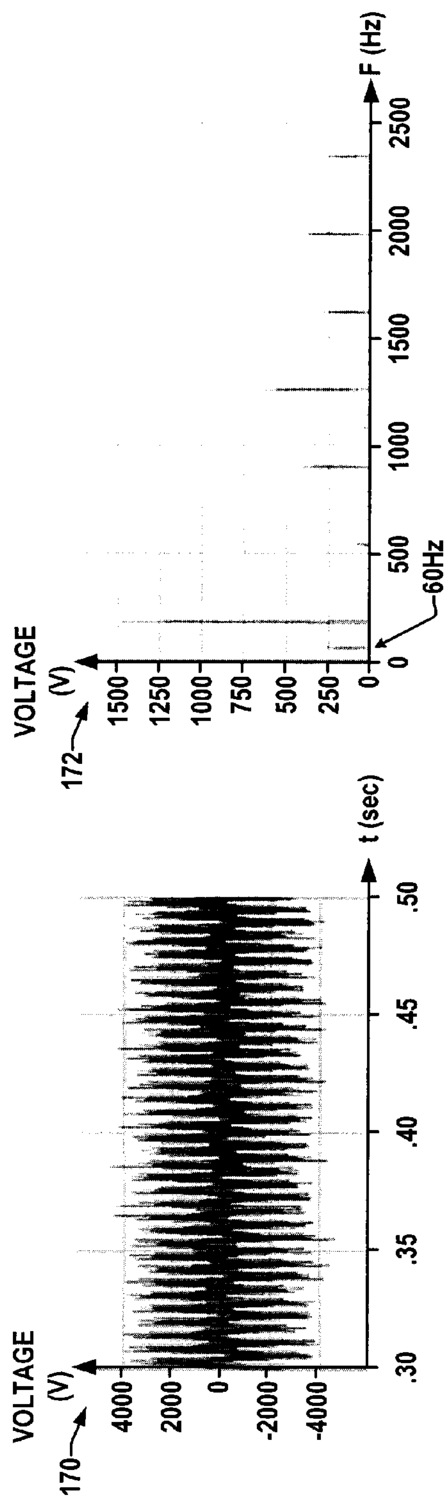

Referring also to FIGS. 7-9, a graph 150 in FIG. 7 illustrates a curve 152 showing change in a fundamental frequency component of a neutral-to-ground voltage in a variable frequency motor drive as a function of current. FIGS. 8 and 9 are composite time domain and frequency domain graphs 160, 162, 170, and 172 showing the change in a 60 Hz fundamental frequency component of a neutral-to-ground voltage in the drive for normal (no-fault) and faulted filter capacitor situations. A no-fault condition is shown in FIG. 8, where graph 160 depicts a time domain neutral-to-ground voltage waveform having a variety of different frequency components, and graph 162 shows a corresponding frequency domain plot of the different frequency components, including a fundamental component at 60 Hz (for a 60 Hz input power source frequency). FIG. 9 illustrates corresponding time and frequency domain graphs 170 and 172 for the neutral-to-ground voltage when a fault condition occurs in one or more input and/or output filter capacitors Ci, Cm. In this example, it is seen that the fundamental 60 Hz component in the graph 172 of FIG. 9 is higher than in the graph 162 of FIG. 8.

Table 1 below includes several exemplary neutral-to-ground voltage fundamental frequency component values $FC_{NO\text{-}FAULT}$ and $FC_{MEASURED}$ (e.g., at 60 Hz) for both no-fault and capacitor fault conditions, at different motor output current levels for each of four exemplary variable frequency drive 110 configurations (direct to drive (D2D) with neutral grounded, D2D with neutral floating, Dc link grounded, and Dc link floating):

TABLE 1

| | Amps | Fundamental component $FC_{NO\text{-}FAULT}$ of Vn-g line side no-fault | Fundamental component $FC_{MEASURED}$ of Vn-g line post-fault | Current unbalance (%) |
|---|---|---|---|---|
| D2D | 61 | 0 | 927 | 16.78% |
| grounded | 160 | 0 | 803 | 7.50% |
| | 215 | 0 | 535 | 4.61% |
| | 625 | 0 | 256 | 2.65% |
| | 630 | 0 | 177 | 2.50% |
| D2D | 61 | 0 | 185 | 16.12% |
| floating | 160 | 0 | 146 | 8.42% |
| | 215 | 0 | 95 | 4.79% |
| | 625 | 0 | 57 | 3.19% |
| | 630 | 0 | 39 | 3.00% |
| DC link | 61 | 0 | 917 | 15.80% |
| grounded | 160 | 0 | 876 | 9.63% |
| | 215 | 0 | 455 | 4.32% |
| | 625 | 0 | 258 | 3.73% |
| DC link | 61 | 2.38 | 922 | 15.70% |
| floating | 160 | 30.8 | 664 | 9.40% |
| | 215 | 26 | 376 | 4.51% |
| | 625 | 25.7 | 257 | 3.69% |

As seen in the above Table 1, the no-fault value of the neutral-to-ground voltage fundamental frequency component $FC_{NO\text{-}FAULT}$ may be zero or may have a non-zero value, and the fault condition causes a discernable change in the measured fundamental frequency component $FC_{MEASURED}$.

Figure 10:
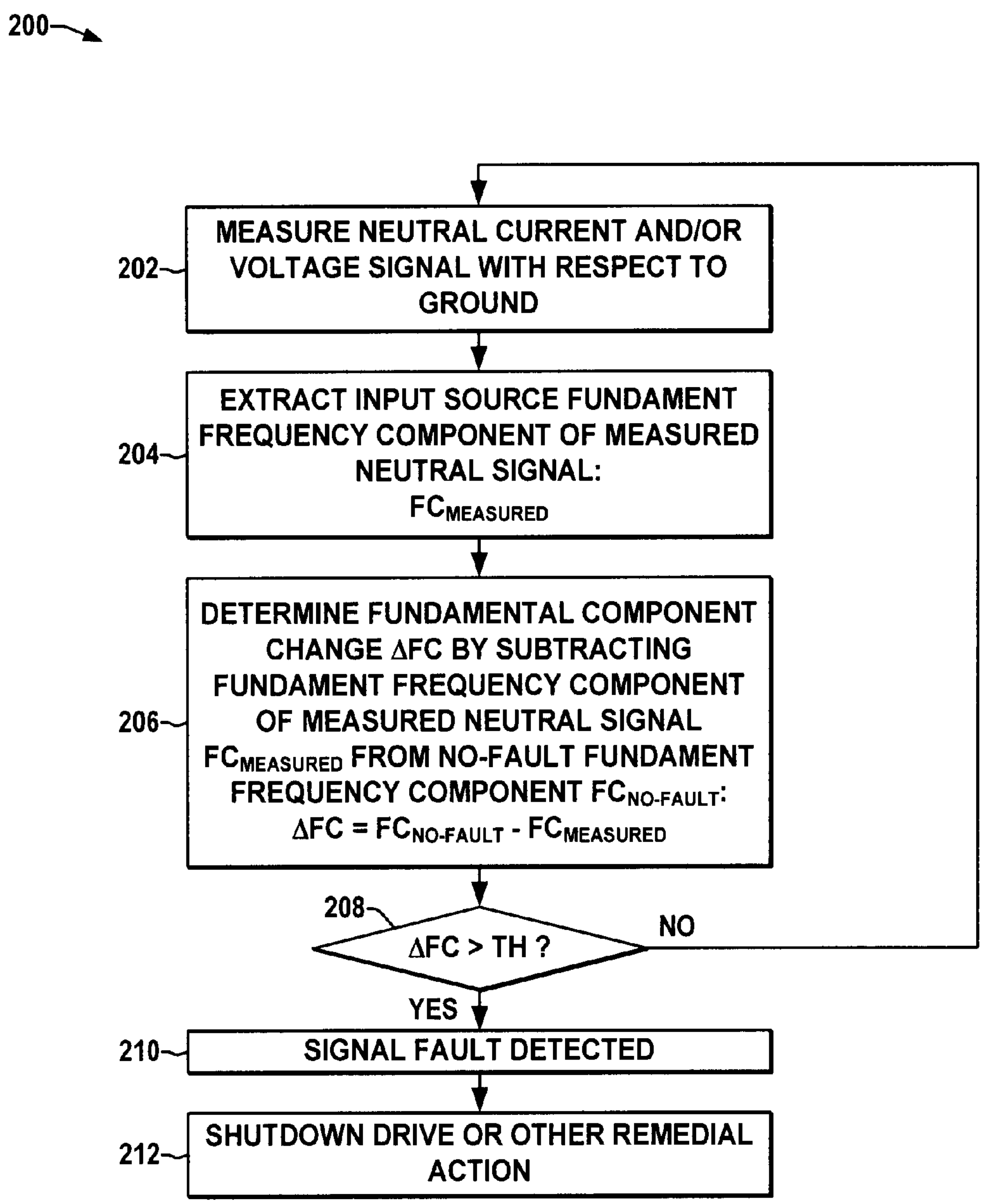
FIG. 10 is a flow diagram illustrating an exemplary method for operating a VFD motor drive in accordance with further aspects of the disclosure.

Referring to FIGS. 1 and 10, the capacitor fault detection component 144*c* (FIG. 1) uses this concept to detect whether a capacitor fault is suspected in the drive 110. The capacitor fault detection circuit 144*c* in certain embodiments is implemented as part of the switch control system 140, but can be a separate processor-based system operatively associated with the drive 110 so as to receive at least one neutral feedback signal or value 118*a* from the feedback circuit 118. The fault detection component 144*c* in one embodiment operates generally according to an exemplary fault detection method 200 in FIG. 10. While the method 200 is illustrated and described below in the form of a series of acts or events, it will be appreciated that the various methods of the disclosure are not limited by the illustrated ordering of such acts or events. In this regard, except as specifically provided hereinafter, some acts or events may occur in different order and/or concurrently with other acts or events apart from those illustrated and described herein in accordance with the disclosure. It is further noted that not all illustrated steps may be required to implement a process or method in accordance with the present disclosure, and one or more such acts may be combined. The illustrated methods and other methods of the disclosure may be implemented in hardware, processor-executed software, or combinations thereof, in order to provide the VFD capacitor fault detection functionality described herein, and may be employed in any power conversion system including but not limited to the above illustrated systems.

At 202 in FIG. 10, the feedback system 118 measures the neutral current and/or neutral voltage (e.g., neutral-to-ground voltage in one example) of one or both of the neutral nodes $N_I$, $N_O$. At 204, capacitor fault detection circuit 144*c* extracts a measured fundamental frequency component $FC_{MEASURED}$ from the neutral feedback signal(s) or value(s) 118*a* at a fundamental frequency of the AC electrical input power. In certain embodiments, the fundamental frequency component extraction at 204 includes performing digital filtering on the neutral feedback signal(s) or value(s) 118*a*. In certain embodiments, moreover, the capacitor fault detection circuit 144*c* may perform a fast Fourier transform (FFT) on one or more neutral feedback signal(s) or value(s) 118*a* at 204 to extract the measured fundamental frequency component $FC_{MEASURED}$.

At 206 and 208, the capacitor fault detection circuit 144*c* determines whether a fault condition is suspected in at least one of the filter capacitors Ci, Cm based at least partially on the measured fundamental frequency component $FC_{MEASURED}$ by any suitable technique. In one embodiment, the fault detection circuit 144*c* determines a fundamental component change value ΔFC at 206 by subtracting the measured fundamental frequency component $FC_{MEASURED}$ from a no-fault fundamental frequency component value $FC_{NO\text{-}FAULT}$ (e.g., using a corresponding table as shown above, which may be stored in memory of the controller 140). The fault detection circuit 144*c* in this example compares the fundamental component change value ΔFC to a threshold value TH at 208 and determines that a fault condition is suspected (YES at 208) in at least one of the filter capacitors Ci, Cm if the fundamental component change value ΔFC is greater that the threshold value TH. In one example, a threshold TH can be established at a suitable value less than the difference between the fault condition $FC_{MEASURED}$ values and the no-fault fundamental frequency component values $FC_{NO\text{-}FAULT}$ from the table above, and then used in detecting capacitor faults. If no fault is detected (NO at 208), the process repeats at 202-208 to continue monitoring the capacitor status. If a fault is detected, moreover, the fault detection circuit 144*c* in certain embodiments may signal detection of a fault at 210, for example, as a signal or message to the controller 140 or external system (not shown), and the fault detection circuit 144*c* and/or the controller 140 may thereupon shut the drive down or take other preprogrammed remedial action at 212.

In accordance with further aspects of the present disclosure, a non-transitory computer readable medium is provided, such as a computer memory, a memory within a power converter control system (e.g., switch control system 140 in FIGS. 1 and 11 above, a CD-ROM, floppy disk, flash drive, database, server, computer, etc.) which has computer executable instructions for performing the process steps of FIG. 10. In this regard, the Referring also to FIG. 11, the fault detection circuit 144*c* and the above techniques can be implemented in voltage source converter (VSC) type variable frequency drives 110*a*, which operate generally as described above, with the intermediate DC link circuit 150 including one or more link capacitors $C_{DC}$ instead of a link choke. In this example, moreover, the input filter circuit 112 includes LCL type filters (e.g., similar to FIG. 3 above) for each line with two inductors Li1 and Li2 in each line, and the output filter circuit 113 includes output inductors Lo connected in each output phase line in an LC filter configuration (e.g., FIG. 2).

Figure 12:
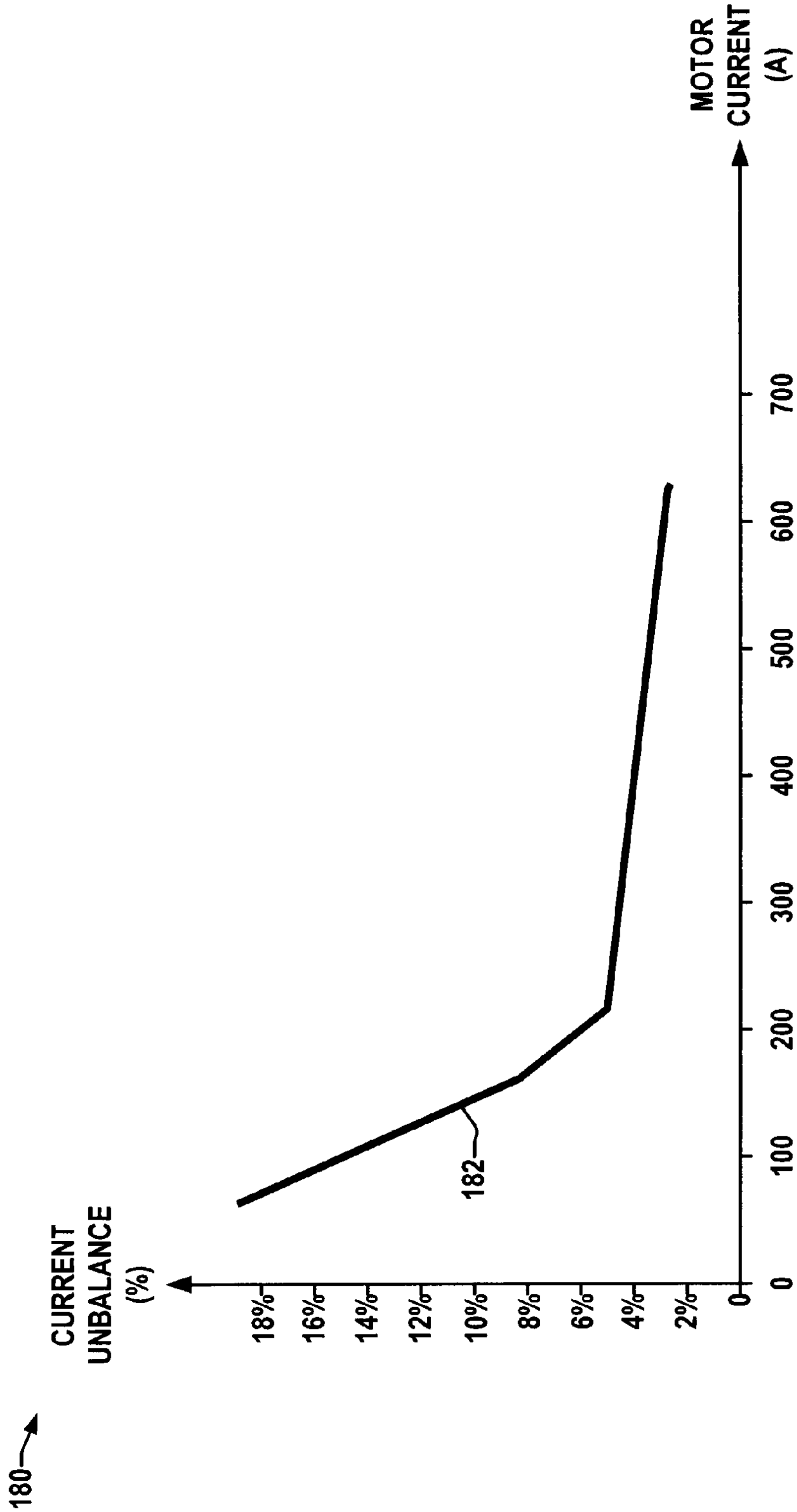
FIG. 12 is a graph illustrating change in current unbalance as a function of motor current in a D2D VFD.

Referring also to FIG. 12, a graph 180 illustrates a curve 182 showing percent current unbalance fault suspicion threshold values as a function of motor current in a D2D VFD. In accordance with certain embodiments of the disclosure, the capacitor fault detection circuit 144*c* or other component of the switch control system 140 monitors the VFD line currents from the input source 111, for example, based on one or more feedback signals 118*a* from the feedback system 118. The control system 140 calculates at least one input current unbalance value, for example, a percentage calculated according to all the monitored input phase line currents. The capacitor fault detection circuit 144*c* in certain embodiments determines whether a fault condition is suspected in at least one of the input filter capacitors Ci at least partially based on the input current unbalance value(s). In certain embodiments, the fault suspicion determination is based on both the measured fundamental frequency component $FC_{MEASURED}$ and the input current unbalance value(s). In other embodiments, either of these considerations can be used by the fault detection circuit 144*c* to determine whether a fault condition is suspected in at least one of the input filter capacitors Ci, for example by any suitable technique. In other embodiments, any or all of the measured neutral voltage(s) and/or current(s), the measured fundamental frequency component $FC_{MEASURED}$, and/or the input current unbalance value(s) can be used to determine whether a capacitor fault condition is suspected. As shown in the right-most column of Table 1 above, for instance, the fault detection circuit 144*c* compares the sensed unbalance (e.g., percentage in one example) to the fault unbalance threshold value (e.g., corresponding value of curve 182 in FIG. 12 or the value from Table 1, using interpolation as needed). In such embodiments, if the sensed current unbalance value exceeds the threshold, the fault detection circuit 144*c* determines that a fault condition is suspected in at least one of the input filter capacitors Ci. In this regard, under normal conditions, the unbalance will generally be zero, and when an input capacitor fault occurs, the unbalance level changes, and this change can be used by the controller 140 to detect a suspected capacitor failure.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A variable frequency drive, comprising:

a rectifier providing rectified DC electrical power at a DC output;

an intermediate DC circuit coupled with the DC output of the rectifier;

an inverter coupled with the intermediate DC circuit and operative to provide variable frequency AC electrical power to a load;

at least one filter circuit comprising a plurality of filter capacitors coupled to a neutral node;

a feedback circuit coupled with the neutral node and providing at least one neutral feedback signal or value based on a sensed condition of the neutral node; and a capacitor fault detection circuit receiving the at least one neutral feedback signal or value from the feedback circuit and operative to extract a measured frequency component from the at least one neutral feedback signal or value, and to determine whether a fault condition is suspected in at least one of the filter capacitors based at least partially on the measured frequency component.

2. The variable frequency drive of claim 1, where the capacitor fault detection circuit is operative to determine a component change value by subtracting the measured frequency component from a no-fault frequency component value and to determine whether a fault condition is suspected in at least one of the filter capacitors based at least partially on the component change value.

3. The variable frequency drive of claim 2, where the capacitor fault detection circuit is operative to compare the component change value to a threshold value TH and to determine that a fault condition is suspected in at least one of the filter capacitors if the component change value is greater that the threshold value.

4. The variable frequency drive of claim 1, where the capacitor fault detection circuit is operative to perform digital filtering on the at least one neutral feedback signal or value to extract the measured frequency component from the at least one neutral feedback signal or value at the frequency of the AC electrical input power.

5. The variable frequency drive of claim 1, where the capacitor fault detection circuit is operative to perform a fast Fourier transform (FFT) on the at least one neutral feedback signal or value to extract the measured frequency component from the at least one neutral feedback signal or value at the frequency of the AC electrical input power.

6. The variable frequency drive of claim 1, where the feedback circuit is operative to provide the at least one neutral feedback signal or value based on at least one sensed voltage associated with the neutral node.

7. The variable frequency drive of claim 1, where the feedback circuit is operative to provide at least one neutral feedback signal or value based on at least one sensed current associated with the neutral node.

8. The variable frequency drive of claim 1, where the at least one filter circuit includes an input filter circuit comprising a plurality of input filter capacitors coupled to an input neutral node.

9. The variable frequency drive of claim 1, where the at least one filter circuit includes an output filter circuit comprising a plurality of output filter capacitors coupled to an output neutral node.

10. The variable frequency drive of claim 1, where the rectifier, the intermediate DC circuit, and the inverter form a current source converter.

11. The variable frequency drive of claim 1, where the rectifier is an active rectifier comprising a rectifier switching network including a plurality of rectifier switching devices individually coupled between one of a plurality of AC input nodes and one of a first DC output node and a second DC output node of the rectifier, the rectifier switching devices individually operable to selectively couple the corresponding AC input node with the corresponding DC output node according to a corresponding rectifier switching control signal; the variable frequency drive further comprising a rectifier controller operative to provide the rectifier switching control signals to cause the rectifier to convert AC electrical input power to provide regulated DC power to the intermediate DC circuit.

12. The variable frequency drive of claim 1, where the capacitor fault detection circuit is operative to determine whether a fault condition is suspected in at least one of the filter capacitors based at least partially on at least one input current unbalance value associated with AC electrical input power received by the rectifier.

13. A method for detecting filter capacitor faults in a variable frequency drive, the method comprising:

measuring at least one condition of a neutral node coupled to a plurality of filter capacitors of at least one filter circuit of a variable frequency drive;

extracting a measured frequency component from the at least one measured neutral condition; and determining whether a fault condition is suspected in at least one of the filter capacitors based at least partially on the measured frequency component.

14. The method of claim 13, where determining whether a fault condition is suspected comprises:

subtracting the measured frequency component from a no-fault frequency component value to determine a component change value; and determining whether a fault condition is suspected in at least one of the filter capacitors based at least partially on the component change value.

15. The method of claim 14, where determining whether a fault condition is suspected comprises:

comparing the component change value to a threshold value; and determining that a fault condition is suspected in at least one of the filter capacitors if the component change value is greater that the threshold value.

16. The method of claim 13, where determining whether a fault condition is suspected comprises determining whether a fault condition is suspected based at least partially on an input current unbalance value or values associated with the AC electrical input power.

17. A non-transitory computer readable medium with computer executable instructions for detecting filter capacitor faults in a variable frequency drive, the computer readable medium comprising computer executable instructions for:

measuring at least one condition of a neutral node coupled to a plurality of filter capacitors of at least one filter circuit of a variable frequency drive;

extracting a measured frequency component from the at least one measured neutral condition; and determining whether a fault condition is suspected in at least one of the filter capacitors based at least partially on the measured frequency component.

18. The non-transitory computer readable medium of claim 17, comprising computer executable instructions for:

subtracting the measured frequency component from a no-fault frequency component value to determine a component change value; and determining whether a fault condition is suspected in at least one of the filter capacitors based at least partially on the component change value.

19. The non-transitory computer readable medium of claim 18, comprising computer executable instructions for:

comparing the component change value to a threshold value; and determining that a fault condition is suspected in at least one of the filter capacitors if the component change value is greater that the threshold value.

20. The non-transitory computer readable medium of claim 17, comprising computer executable instructions for:

performing digital filtering on the at least one measured neutral condition to extract the measured frequency component.

21. The non-transitory computer readable medium of claim 17, comprising computer executable instructions for:

performing a fast Fourier transform (FFT) on the at least one measured neutral condition to extract the measured frequency component.

22. The non-transitory computer readable medium of claim 17, comprising computer executable instructions for:

measuring the at least one condition of the neutral node by measuring at least one sensed voltage associated with the neutral node.

23. The non-transitory computer readable medium of claim 17, comprising computer executable instructions for:

measuring the at least one condition of the neutral node by measuring at least one sensed current associated with the neutral node.

24. The non-transitory computer readable medium of claim 17, comprising computer executable instructions for:

determining whether a fault condition is suspected in at least one of the filter capacitors based at least partially on at least one input current unbalance value associated with AC electrical input power received by the variable frequency drive.

* * * * *